(12) United States Patent
Kim et al.

(10) Patent No.: US 11,802,238 B2
(45) Date of Patent: Oct. 31, 2023

(54) LIGAND EXCHANGE OF PEROVSKITE QUANTUM DOTS AND SOLAR CELL DEVICES MANUFACTURED USING THE SAME

(71) Applicant: DAEGU GYEONGBUK INSTITUTE OF SCIENCE AND TECHNOLOGY, Daegu (KR)

(72) Inventors: Younghoon Kim, Daegu (KR); Jigeon Kim, Daegu (KR)

(73) Assignee: DAEGU GYEONGBUK INSTITUTE OF SCIENCE AND TECHNOLOGY, Daegu (KR)

(*) Notice: Subject to any disclaimer, the term of this patent is extended or adjusted under 35 U.S.C. 154(b) by 88 days.

(21) Appl. No.: 16/838,387

(22) Filed: Apr. 2, 2020

(65) Prior Publication Data
US 2020/0325391 A1    Oct. 15, 2020

(30) Foreign Application Priority Data

Apr. 12, 2019    (KR) .................. 10-2019-0042960

(51) Int. Cl.
| | |
|---|---|
| C09K 11/02 | (2006.01) |
| C09K 11/66 | (2006.01) |
| H01L 33/26 | (2010.01) |
| H01L 33/06 | (2010.01) |

(Continued)

(52) U.S. Cl.
CPC .......... *C09K 11/025* (2013.01); *C09K 11/665* (2013.01); *H01L 33/06* (2013.01); *H01L 33/26* (2013.01); *B82Y 20/00* (2013.01); *B82Y 40/00* (2013.01)

(58) Field of Classification Search
CPC ........................... C09K 11/665; C09K 11/025
See application file for complete search history.

(56) References Cited

U.S. PATENT DOCUMENTS

2020/0343489 A1* 10/2020 Park .................. H01L 51/56

FOREIGN PATENT DOCUMENTS

| KR | 101478627 B1 | 12/2014 |
|---|---|---|
| KR | 1020170078553 A | 7/2017 |

(Continued)

OTHER PUBLICATIONS

Sanehira. "Enhanced mobility CsPbI3 quantum dot arrays for record-efficiency high-voltage photovoltaic cells". Sci. Adv. 2017;3: eaao4204. (Year: 2017).*

(Continued)

*Primary Examiner* — Matthew E. Hoban
(74) *Attorney, Agent, or Firm* — Harness, Dickey & Pierce, P.L.C

(57) ABSTRACT

The present invention relates to a ligand-exchanged inorganic perovskite quantum dot thin film and a solar cell comprising the same. The inorganic perovskite quantum dot thin film provided in one aspect of the present invention is capable of more effective ligand exchange by directly inserting the organic ligand ion-based salt generating organic ligand ions, and the thin film can be used to prepare solar cells with high power conversion efficiency. Therefore, the thin film of the present invention can contribute to the commercialization of perovskite quantum dot solar cells in the future.

5 Claims, 19 Drawing Sheets
(6 of 19 Drawing Sheet(s) Filed in Color)

(51) Int. Cl.
    *B82Y 40/00*    (2011.01)
    *B82Y 20/00*    (2011.01)

(56) References Cited

FOREIGN PATENT DOCUMENTS

KR    101863866 B1    6/2018
KR    101878341 B1    7/2018

OTHER PUBLICATIONS

Korean Notice of Allowance dated Oct. 21, 2020 issued in corresponding Korean Appln. No. 10-2019-0042960.
Swarnkar, A. et al., "Solar Cells, Quantum dot-induced phase stabilization of a-CsPbI3 perovskite for high-efficiency photovoltaics," Science 354 (6308), Oct. 7, 2016, pp. 92-95.
Sanehira, E. et al., "Surface Chemistrym Enhanced mobility CsPbI3 quantum dot arrays for record-efficiency, high-voltage photovoltaic cells," Sci. Adv., 3, Oct. 27, 2017, 9 pgs.
English Abstract for Korean Publication No. KR 10-1478627 B, published Dec. 26, 2014, 1 pg.
English Abstract for Korean Publication No. KR 10-2017-0078553 A, published Jul. 7, 2017, 1 pg.
English Abstract for Korean Publication No. KR 10-1863866 B, published Jun. 1, 2018, 1 pg.
English Abstract for Korean Publication No. KR 10-1878341 B, published Jul. 13, 2018, 1 pg.

* cited by examiner

|  | $V_{oc}$ (V) | $J_{sc}$ (mA/cm²) | FF (%) | PCE (%) |
|---|---|---|---|---|
| Pb(NO₃)₂ and FAI treatment | 1.16 | 14.8 | 72.1 | 12.4 |
| NaOAc and FAI treatment | 1.18 | 15.2 | 74.2 | 13.3 |

LIGAND EXCHANGE OF PEROVSKITE QUANTUM DOTS AND SOLAR CELL DEVICES MANUFACTURED USING THE SAME

CROSS-REFERENCES TO RELATED APPLICATION

This patent application claims the benefit of priority under 35 U.S.C. § 119 from Korean Patent Application No. 10-2019-0042960 filed on Apr. 12, 2019, the contents of which are incorporated herein by reference.

BACKGROUND OF THE INVENTION

1. Field of the Invention

The present invention relates to ligand exchange of perovskite quantum dots and a solar cell device manufactured using the same.

2. Description of the Related Art

Recently, interest in new and renewable energy is increasing due to soaring oil prices, depletion of fossil fuels, regulations on carbon dioxide discharge, etc. In particular, research and development on solar power system, a pollution-free and inexhaustible domestically and internationally. A solar cell is a key device of the solar power system that converts sunlight directly into electricity.

Inorganic $CsPbX_3$ (X=Cl, Br, I) perovskite colloid quantum dots (CQDs) have received considerable attention in the field of photovoltaic, light emitting diode and laser because of their easy optical properties and excellent photophysical properties of synthesis, size and configuration adjustment. In particular, $CsPbX_3$ perovskite quantum dots ($CsPbX_3$-PQDs) are the highest performing photoelectric cell absorption apparatus with a power conversion efficiency of 13.4%, which is a very interesting topic in the field of CQD solar cell.

Among them, $CsPbI_3$ perovskite quantum dots are easily decomposed by the polar solvent due to the ionic bonding property, so it was difficult to select the polar anti-solvent during the purification process. $CsPbI_3$ perovskite quantum dots are covered with oleate and oleylammonium ligands as surface ligands. Since oleate and oleviammonium ligands with long hydrocarbon chain have insulating properties in quantum dot thin films, they must be removed to be applied to photoelectric elements.

In the prior art, $CsPbI_3$ perovskite quantum dots were successfully purified using methyl acetate (MeOAc) with weak polarity (non-patent reference 1, Quantum dot-induced phase stabilization of α-$CsPbI_3$ perovskite for high efficiency photovoltaics, Science 354 (6308), 92-95 (2016)). The key reaction in this ligand exchange process is the hydrolysis of methyl acetate. Methyl acetate reacts with $H_2O$ adsorbed on the surface of perovskite and is hydrolyzed, resulting in the formation of acetic acid and methanol, and the acetate ions produced by the release of hydrogen ions from acetic acid displace oleate to bind on the surface of $CsPbI_3$ perovskite quantum dots. Oleate is removed through this process. The results of research on the implementation of a solar cell having an efficiency of 10.7% using the $CsPbI_3$ perovskite quantum dot thin film as a photoactive layer have been reported.

In another prior art, formamidinium iodide (FAI) cost-treatment was introduced for the removal or oleate as well as oleyl ammonium ligands (non-patent reference 2, Enhanced mobility $CsPbI_3$ quantum dot arrays for record-efficiency, high-voltage photovoltaic cells, Sci. Adv. 3 (10), eaao4204 (2017)). Formamidinium ions ($FA^+$) generated through FAT post-treatment are bound by substituting oleylammonium on the surface of $CsPbI_3$ perovskite quantum dots. Improvements in efficiency up to 13.4% by removing oleylammonium to improve the charge mobility of the $CsPbI_3$ perovskite quantum dot thin film have been reported.

However, acetic acid and methanol are produced during the hydrolysis of methyl acetate, and perovskite, which has poor chemical stability due to ionic bonding, may be decomposed in an acidic or alcoholic atmosphere. In addition, the FAI post-treatment improves the efficiency of a solar cell, but decreases the open voltage of the solar cell device performance, resulting in large energy loss and shortening the lifespan of the solar cell as the stability deteriorates due to the supply of FA, the organic material. $MgF_2$ anti-reflection coating is necessary to realize a high efficiency quantum dot solar cell exceeding PCE 13% through the conventional technique using methyl acetate and FAI. The introduction of such an anti-reflection coating process is an additional obstacle to future commercialization because it requires an additional process cost. As another conventional technique, a technique using lead acetate ($Pb(OAc)_2$) has been reported, but when lead acetate is used, $Pb^{2+}$ acts as a precursor to grow perovskite crystals. This causes a problem that the perovskite crystals grow and the $CsPbI_3$ perovskite quantum dots are agglomerated in a needle shape. In addition, the efficiency of the solar cell is reduced because a large amount of —OH is generated.

SUMMARY OF THE INVENTION

In an aspect of the present invention, it is an object of the present invention to provide an inorganic perovskite quantum dot thin film in which surface ligands are exchanged by anions generated by dissociation of alkali metal salt.

In another aspect of the present invention, it is an object of the present invention to provide a solar cell with an excellent photoelectric conversion efficiency comprising the inorganic perovskite quantum dot thin film in which surface ligands are exchanged.

In another aspect of the present invention, it is an object of the present invention to provide a preparation method of the inorganic perovskite quantum dot thin film comprising the step of exchanging the quantum dot surface ligands effectively using alkali metal salt.

To achieve the above objects, in an aspect of the present invention, the present invention provides an inorganic perovskite quantum dot thin film comprising:

an inorganic perovskite quantum dot layer; and a surface treated layer placed on the surface of the quantum dot layer and treated with the ligand exchange solution containing the ionic salt represented by formula 1 below.

$$R^1COO^-A^+ \quad \text{[Formula 1]}$$

(In formula 1, $R^1$ is $C_{1-5}$ straight or branched alkyl; and $A^+$ is $Na^+$ or $K^+$).

In another aspect of the present invention, the present invention provides a solar cell comprising the inorganic perovskite quantum dot thin film.

In another aspect of the present invention, the present invention provides a preparation method of the inorganic perovskite quantum dot thin film comprising the following steps:

forming an inorganic perovskite quantum dot layer; and treating the surface of the quantum dot layer with a ligand exchange solution containing the ionic salt represented by formula 1, and replacing the surface ligand with the ions represented by formula 2 generated by dissociation of the salt of formula 1.

$$R^1COO^-A^+ \quad \text{[Formula 1]}$$

(In formula 1,
$R^1$ is $C_{1-5}$ straight or branched alkyl; and
$A^+$ is $Na^+$ or $K^+$);

$$R^2COO^- \quad \text{[Formula 2]}$$

(In formula 2,
$R^2$ is $C_{1-5}$ straight or branched alkyl).

Advantageous Effect

The inorganic perovskite quantum dot thin film provided in one aspect of the present invention is capable of more effective ligand exchange by directly inserting the organic ligand ion-based salt capable of minimizing hydrolysis reaction to exchange surface ligands of perovskite quantum dots having insulating properties. The thin film can be used to prepare solar cells with high photoelectric conversion efficiency. Therefore, the thin film can contribute to the commercialization of perovskite solar cells in the future.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE PREFERRED EMBODIMENTS

Figure 1:
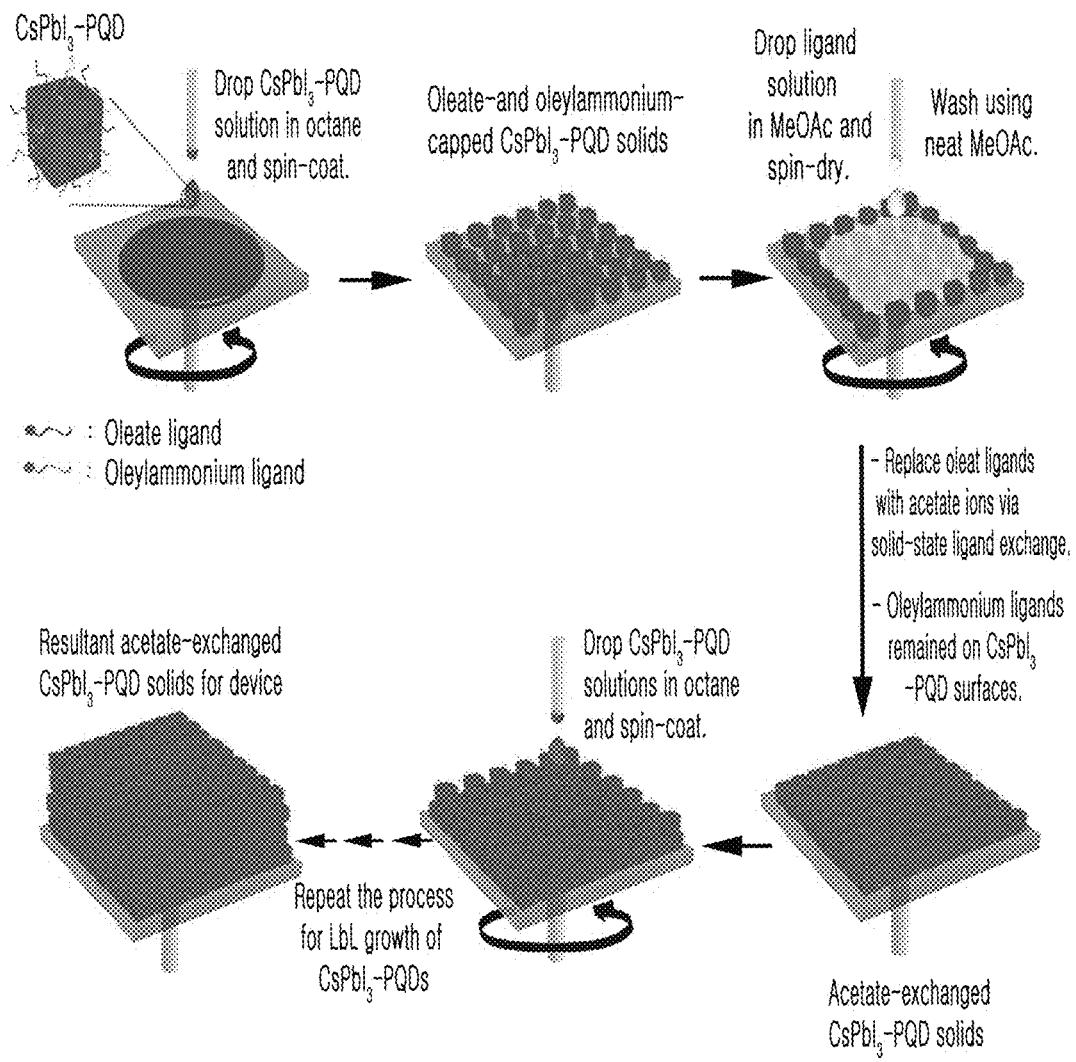
FIG. 1 is a diagram showing the process of LbL (layer by layer) producing $CsPbI_3$-PQDs, solid-state ligand exchange reaction.
Figure 2A:
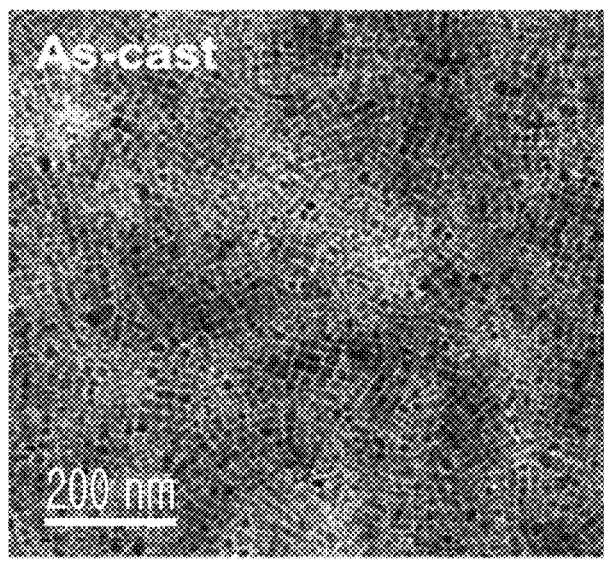
FIG. 2A is a diagram showing the result of high resolution transmission electron microscopy of $CsPbI_3$-PQDs (as-cast).
Figure 2B:
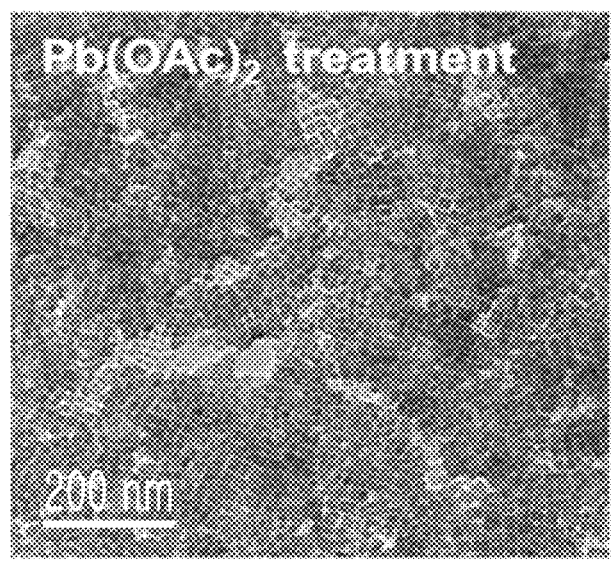
FIG. 2B is a diagram showing the result of high resolution transmission electron microscopy of $CsPbI_3$-PQDs (Pb$(OAc)_2$ treatment).
Figure 2C:
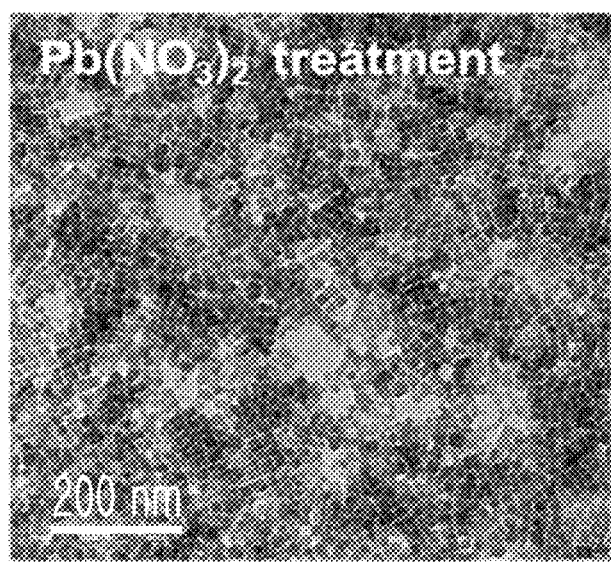
FIG. 2C is a diagram showing the result of high resolution transmission electron microscopy of $CsPbI_3$-PQDs(Pb$(NO_3)_2$ treatment).
Figure 2D:
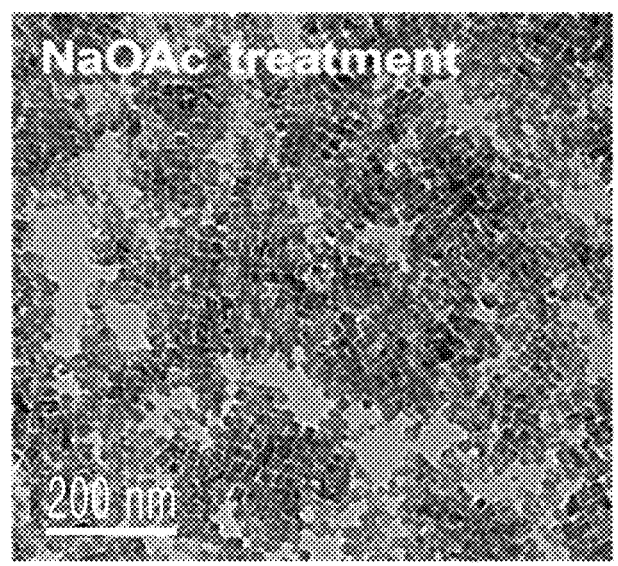
FIG. 2D is a diagram showing the result of high resolution transmission electron microscopy of $CsPbI_3$-PQDs (NaOAc treatment).

Hereinafter, the present invention is described in detail.

The embodiments of this invention can be modified in various other forms, and the scope of the present invention is not limited to the embodiments described below. It is well understood by those in the art who has the average knowledge on this field that the embodiments of the present invention are given to explain the present invention more precisely. In addition, the "inclusion" of an element throughout the specification does not exclude other elements, but may include other elements, unless specifically stated otherwise.

As mentioned above, perovskite covered with ligands with long hydrocarbon chains on the surface must be removed due to the insulating properties of the surface ligands. Thus, there is a prior art that ligands were successfully exchanged using methyl acetate. However, methanol and acetic acid are produced during the hydrolysis of methyl acetate. And there is a problem that the ion-binding perovskite has a high risk of decomposition in acid or alcohol environments. As another conventional technique, a technique using lead acetate (Pb$(OAC)_2$) has been reported, but when lead acetate is used, $Pb^{2+}$ acts as a precursor to grow perovskite crystals. This causes a problem that the perovskite crystals grow and the $CsPbI_3$ perovskite quantum dots are agglomerated in a needle shape. In addition, the efficiency of the solar cell is reduced because a large amount of —OH is generated.

Thus, in one aspect of the present invention, a ligand exchange solution comprising alkali metal cation-based salt that can provide ligands directly without undergoing hydrolysis is provided in order to solve the problem of surface ligand exchange of the perovskite quantum dots. As a result of exchanging the surface ligand of the quantum dot thin film by the ligand exchange solution, it was found that the long carbon chain ligand on the surface was effectively replaced with the short carbon chain ligand. In addition, the solar cell using the quantum dot thin film with the exchanged surface ligand as a photoactive layer can increase the power conversion efficiency up to 12.4%, so that a highly efficient solar cell can be prepared using the quantum dot thin film provided in one aspect of the present invention.

In an aspect of the present invention, the present invention provides an inorganic perovskite quantum dot thin film comprising:

an inorganic perovskite quantum dot layer; and a surface treated layer placed on the surface of the quantum dot layer and treated with the ligand exchange solution containing the ionic salt represented by formula 1 below.

$$R^1COO^-A^+ \quad \text{[Formula 1]}$$

(In formula 1,
$R^1$ is $C_{1-5}$ straight or branched alkyl; and
$A^+$ is $Na^+$ or $K^+$).

In the inorganic perovskite quantum dot thin film according to the present invention, the surface treated layer is characterized in that the ligands are exchanged by the ions represented by formula 2 generated by dissociation of the ionic salt represented by formula 1.

$$R^2COO^-$$ [Formula 2]

(In formula 2,
$R^2$ is $C_{1-5}$ straight or branched alkyl).

In the inorganic perovskite quantum dot thin film according to the present invention, the surface treated layer can be formed by solid-state ligand exchange (SLE) reaction.

Particularly, the solid-state ligand exchange reaction can be performed on the quantum dot thin film.

The inorganic perovskite quantum dots provided in one aspect of the present invention can be the perovskite quantum dots represented by formula 3 below.

$$BCX_3$$ [Formula 3]

In formula 3,
B is one element of Cs, Rh, Ba, In, K and Ti, C is one element of Pb, Sn, Bi, Ag, Ge and Zr, and X is one element of F, Cl, Br and I.

The perovskite quantum dots represented by formula 3 can be $CsPbI_3$ perovskite quantum dots.

In the perovskite quantum dot thin film provided in another aspect of the present invention, the surface treated layer can be treated with formamidinium iodide (FAI) after treatment with the ligand exchange solution containing the ionic salt represented by formula 1 below.

$$R^1COO^-A^+$$ [Formula 1]

(In formula 1,
$R^1$ is $C_{1-5}$ straight or branched alkyl; and
$A^+$ is $Na^+$ or $K^+$).

In the perovskite quantum dot thin film provided in another aspect of the present invention, the ionic salt represented by formula 1 is $CH_3COO^-Na^+$ (sodium acetate).

In another aspect of the present invention, the present invention provides a solar cell comprising the inorganic perovskite quantum dot thin film.

The solar cell provided in one aspect of the present invention can include a quantum dot thin film in which surface ligands are exchanged by short carbon chains as a photoactive layer. The solar cell has a high current density capable of obtaining a power conversion efficiency of 12.4%. In addition, the solar cell comprising the quantum dot thin film treated with formamidium iodide (FAI) for additional ligand exchange as a photoactive layer exhibits excellent power conversion efficiency of up to 13.3%. Such experimental results have been described in detail in the following experimental examples.

In another aspect of the present invention, the present invention provides a preparation method of the inorganic perovskite quantum dot thin film comprising the following steps:

forming an inorganic perovskite quantum dot layer; and treating the surface of the quantum dot layer with a ligand exchange solution containing the ionic salt represented by formula 1, and replacing the surface ligand with the ions represented by formula 2 generated by dissociation of the salt of formula 1.

$$R^1COO^-A^+$$ [Formula 1]

(In formula 1,
$R^1$ is $C_{1-5}$ straight or branched alkyl; and
$A^+$ is $Na^+$ or $K^+$).

$$R^2COO^-$$ [Formula 2]

(In formula 2,
$R^2$ is $C_{1-5}$ straight or branched alkyl).

Hereinafter, the preparation method of the inorganic perovskite quantum dot thin film provided in an aspect of the present invention will be described in detail step by step.

Hereinafter, the preparation method of the $CsPbI_3$ perovskite quantum dot thin film as an example of the inorganic perovskite quantum dot thin film will be described.

In the preparation method of the inorganic perovskite quantum dot thin film provided in an aspect of the present invention, step 1 is to form an inorganic perovskite quantum dot layer.

The quantum dot layer can be formed by spin-coating $CsPbI_3$-PQD pellets dispersed in octane (75 mg/mL). The rpm and time of the spin-coating can be properly adjusted according to the reaction conditions. Preferably, the spin-coating can be performed for 5 to 30 seconds at 1000 to 2000 rpm, and the spin-coating can be repeated several times as necessary.

The $CsPbI_3$-PQD pellets can be prepared by the preparation method of toe preparative example described later. The compounds such as solvents and gases and the conditions such as temperature and reaction time for the $CsPbI_3$-PQD pellet production can be used without particular limitation as long as the $CsPbI_3$-PQD pellets can be well separated and obtained.

In the preparation method of the inorganic perovskite quantum dot thin film provided in an aspect of the present invention, step 2 is to treat the surface of the quantum dot layer with a ligand exchange solution containing the ionic salt represented by formula 1, and replace the surface ligand with the ions represented by formula generated by dissociation of the salt of formula 1.

$$R^1COO^-A^+$$ [Formula 1]

(In formula 1,
$R^1$ is $C_{1-5}$ straight or branched alkyl; and
$A^+$ is $Na^+$ or $K^+$).

$$R^2COO^-$$ [Formula 2]

(In formula 2,
$R^2$ is $C_{1-5}$ straight or branched alkyl).

The step of replacing the surface ligand with the ions represented by formula 2 can be performed by solid-state ligand exchange (SLE) reaction.

Particularly, the solid-state ligand exchange reaction can be performed on the inorganic perovskite quantum dot thin film.

The preparation method of the inorganic perovskite quantum dot thin film can be performed by the LBL (layer by layer) method in which each step is repeatedly performed two to eight times. It Is possible to form a film having a desired thickness through the LBL method, preferably to a thickness of about 300 nm.

In another aspect of the present invention, the salt of formula 1 is $CH_3COO^-Na^+$ (sodium acetate).

The inorganic perovskite quantum dot thin film provided in one aspect of the present invention provides ions directly without hydrolysis reaction, so that long carbon chain ligands on the surface can be substituted with short carbon chain ligands very efficiently. In addition, a solar cell comprising the quantum dot thin film has a high current density and high power conversion efficiency. Therefore, the inorganic perovskite quantum dot thin film can make a significant contribution to the commercialization of solar cells, which may be directly supported by the following examples and experimental examples.

Hereinafter, the present invention will be described in detail by the following examples.

However, the following examples are only for illustrating the present invention, and the contents of the present invention are not limited thereto.

Preparative Example 1

Preparation of Colloidal CsPbI$_3$-PQDs

To prepare an solution of Cs-oleate, CsCO$_3$ (0.4078 g), 1-octadecene (20 ml) and oleic acid (1.25 were placed in a 100 mL, 3-neck round flask, followed by degassing at 120° C. for 30 minutes in vacuum. The flask was filled with N$_2$ gas and the gas was removed again. An solution of Cs-oleate was prepared by repeating this process three times, which was stored in N$_2$.

To prepare CsPbI$_3$PQDs, PbI$_2$ (0.5 g) and 1-octadecene (25 ml) were placed in a 100 mL 3-neck round flask, followed by degassing at 115° C. for 30 minutes. Pre-degassed oleic acid (2.5 ml) and oleylamine (2.5 mL) were injected into the flask, followed by degassing at 115° C. for 30 minutes. The flask was filled with N$_2$ gas, then the temperature was raised to 185° C., and Cs-oleate (2 mL) was injected rapidly into the flask. After 10 seconds, the flask was quenched with ice water to room temperature, and MeOAc (35 ml) was added to the synthesized CsPbI$_3$-PQD aqueous solution (15 ml) as a polar solvent to separate the desired CsPbI$_3$-PQDs, followed by centrifugation at 5000 rpm for 3 minutes. After removing the supernatant, the precipitated CsPbI$_3$-PQDs were dispersed in hexane (5 mL) to which MeOAc (7 mL) was added. The solution was centrifuged at 5000 rpm for 3 minutes to remove the supernatant. The precipitated CsPbI$_3$-PQDs were dispersed in hexane (15 mL), followed by centrifugation at 5000 rpm for 3 minutes to remove the aggregated CsPbI$_3$-PQDs. The precipitate was removed and the supernatant was collected and stored at 4° C. in the dark place for 48 hours. After removing the precipitate, hexane was evaporated in vacuum and the dried CsPbI$_3$-PQD pellet was dispersed in octane at the concentration of ~75 mg/mL.

Example 1

Preparation of CsPbI$_3$-PQD Thin Film using Sodium Acetate (NaOAc)

The CsPbI$_3$-PQD solution (75 mg/mL) in octane prepared in Preparative Example 1 was spin-coated at 1000 rpm for 20 seconds and at 2000 rpm for seconds. 1 mg mL$^{-1}$ of NaOAc solution in MeOAc solvent was added to the CsPbI$_3$-PQD film prepared above, which was spin-dried. Then, the ligand exchanged film was washed with MeOAc and spin-dried. The ligand solution treatment and washing processes were performed in an environment in which the relative humidity was controlled at 15%~20% for effective ligand exchange. This process was repeated 4~6 times to make the film had the desired thickness (~300 nm).

Example 2

Preparation of Solar Cell Comprising CsPbI$_3$-PQD Thin Film using Sodium Acetate (NaOAc)

In order to wash the patterned-FTO, it was sonicated sequentially in detergent water, deionized water, acetone, isopropyl alcohol for 10 minutes each. The washed FTO substrate was exposed to UV to remove contaminants and the surface was made hydrophilic for compact TiO$_2$ coating. A sol-gel derived compact TiO$_2$ (c-TiO$_2$) layer, used as ETL in solar cells, was made on the patterned-FTO substrate. The aqueous precursor solution was purchased from Sharechem for convenience, but the included compounds and preparation methods are the same as the reported sol-gel method of Swarnkar et al. The aqueous precursor solution was spin-coated on the FTO substrate at 3000 rpm for 30 seconds, and then the substrate was annealed at 500° C. for 1 hour. After cooling to room temperature, the substrate was immersed in an aqueous solution of TiCl$_4$ (120 mM) at 70° C. for 1 hour. The substrate was washed with deionized water and annealed at 500° C. for 1 hour. TiCl$_4$ treatment improves the quality of the interface of the c-TiO$_2$ layer.

A CsPbI$_3$-PQD thin film layer was prepared on the FTC/c-TiO$_2$ substrate by the method of Example 1 for the preparation of CsPbI$_3$-PQD thin film prepared via solid-state ligand exchange.

The spiro-MeOTAD layer used as HTL in solar cells was spin-coated at 4000 rpm for 30 seconds. The spiro-MeOTAD solution was prepared by the following method. Spiro-MeOTAD (72.3 mg), chlorobenzene (1 mL), 2-amylpyridine (28.8 μL) and Li-TFSI (17.5 μL) solution, which is dissolved in acetonitrile at the concentration of 520 mg/mL, are mixed. MoO$_x$ and a metal electrode are fabricated to a thickness of 15 nm and 120 nm, respectively, using a thermal evaporator.

Comparative Example 1

1.1. Preparation of CsPbI$_3$-POD Thin Film Using Methyl Acetate (MeOAc)

The CsPbI$_3$-PQD solution (75 mg/mL) in octane prepared in Preparative Example 1 was spin-coated at 1000 rpm for 20 seconds and at 2000 rpm for 5 seconds. A MeOAc solution was dropped on the CsPbI$_3$-PQD film prepared above, which was spin-dried. This process was performed in an environment in which the relative humidity was controlled at 15%~20% for effective ligand exchange. This process was repeated 4~6 times to make the film had the desired thickness (~300 nm).

1.2. Preparation of CsPbI$_3$-PQD Thin Film Using Lead Nitrate (Pb(NO$_3$)$_2$)

A CsPbI$_3$-PQD thin film was prepared in the same manner as described in Example 1, except that a lead nitrate (Pb(NO$_3$)$_2$) solution in MeOAc solvent was dropped instead of a NaOAc solution in MeOAc solvent.

1.3 Preparation or CsPbI$_3$-PD Thin Film Using Lead Acetate (Pb(OAc)$_2$)

CsPbI$_3$ thin film was prepared in the same manner as described in Example 1, except that a lead acetate (Pb(OAc)$_2$) solution in MeOAc solvent was dropped instead of a NaOAc solution in MeOAc solvent.

Comparative Example 2

2.1 Preparation of Solar Cell Comprising CsPbI$_3$-PQD Thin Film Using Lead Nitrate (Pb(NO$_3$)$_2$)

A CsPbI$_3$-POD thin film was prepared in the same manner as described in Example 2 except that a CsPbI$_3$-PQD thin film layer was prepared by the method of Comparative Example 1.2 instead of the method of Example 1.

2.2. Preparation of Solar Cell Comprising CsPbI$_3$-PQD Thin Film Using Lead Acetate (Pb(OAc)$_2$)

A CsPbI$_3$-PQD thin film was prepared in the same manner as described in Example 2 except that a CsPbI$_3$-PQD thin film layer Was prepared by the method of Comparative Example 1.3 instead of the method of Example 1.

2.3. Preparation of Solar Cell Comprising CsPbI$_3$-PQD Thin Film Using Lithium Acetate (LiOAc)

A CsPbI$_3$-PQD thin film was prepared in the same manner as described in Example 2 except that a LiOAc solution in MeOAc solvent was used instead of a NaOAc solution in MeOAc solvent for the production of a CsPbI$_3$-PQD thin film layer by the method of Example 1.

2.4. Preparation of Solar Cell Comprising CsPbI$_3$-PQD Thin Film Using Potassium Acetate (KOAc)

A CsPbI$_3$-PQD thin film was prepared in the same manner as described in Example 2 except that a KOAc solution in MeOAc solvent was used instead of a NaOAc solution in MeOAc solvent for the production of a CsPbI$_3$-PQD thin film layer by the method of Example 1.

2.5. Preparation of Solar Cell Comprising CsPbI$_3$-PQD Thin Film Using Rubidium Acetate (RhOAc)

A CsPbI$_3$-PQD thin film was prepared in the same manner as described in Example 2 except that an RhOAc solution in MeOAc solvent was used instead of a NaOAc solution in MeOAc solvent for the production of a CsPbI$_3$-PQD thin film layer by the method of Example 1.

2.6. Preparation of Solar Cell Comprising CsPbI$_3$-PQD Thin Film Using Cesium Acetate (CsOAc)

A CsPbI$_3$-PQD thin film was prepared in the same manner as described in Example 2 except that a CsOAc solution in MeOAc solvent was used instead of a NaOAc solution in MeOAc solvent for the production of a CsPbI$_3$-PQD thin film layer by the method of Example 1.

Experimental Example 1

Analysis of CsPbI$_3$ Perovskite Quantum Dot Thin Film Properties

In order to analyze the properties of the ligand exchanged CsPbI$_3$ perovskite quantum dot thin films using a ligand exchange solution, the following experiments were performed using the CsPbI$_3$-PQD thin films prepared in Example 1 and Comparative Example 1.

1.1. High-Resolution Transmission Electron Microscopy

To confirm the effect of ionic salts dissolved in MeOAc on CsPbI$_3$-PQDs during ligand exchange, high-resolution transmission electron microscopy (HR-TEM) was conducted. The CsPbI$_3$-PQDs dispersed in octane were loaded onto a TEM copper lattice grid and observed under a microscope. Then, an solution of 1 mg mL$^{-1}$ MeOAc containing Pb(NO$_3$)$_2$, NaOAc and Pb(OAc)$_2$ was treated for ligand exchange of the CsPbI$_3$-PQDs on the TEM grid. The results are shown in FIG. 2A to 2D.

The thin film of Comparative Example 1.3 did not have good surface morphology of CsPbI$_3$-PQD solid due to aggregation and fusion of the CsPbI$_3$-PQDs. This suggests that Pb(OAc)$_2$ can act as a lead precursor for the growth of CsPbI$_3$ perovskite crystals during ligand exchange. It was confirmed that the thin films of Example 1 and Comparative Example 1.2 had a larger ratio of empty spaces. This is because the distance between CsPbI$_3$-PQDs was reduced by replacing the long chain of oleate with the short chain of OAc anions while preserving the CsPbI$_3$-PQD size. In particular, the thin film of Example 1 exhibited the largest empty space, which showed that the ligand exchange efficiency by NaOAc of Example 1 was the best.

1.2. X-Ray Diffraction Analysis

X-ray diffraction (XRD) analysis was performed to confirm the fusion of CsPbI$_3$-PQDs. The results are shown in FIG. 3A to 3C.

Figure 3A:
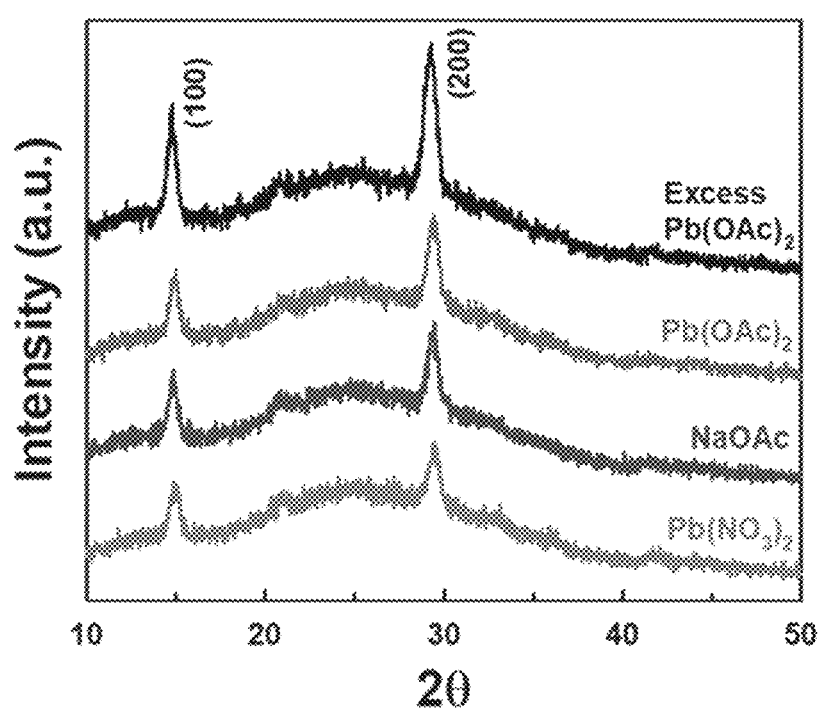
FIG. 3A is a diagram showing the results of X-ray diffraction of $CsPbI_3$-PQD films treated with excess Pb$(OAc)_2$/Pb$(OAc)_2$, NaOAc, Pb$(NO_3)_2$.
Figure 3B:
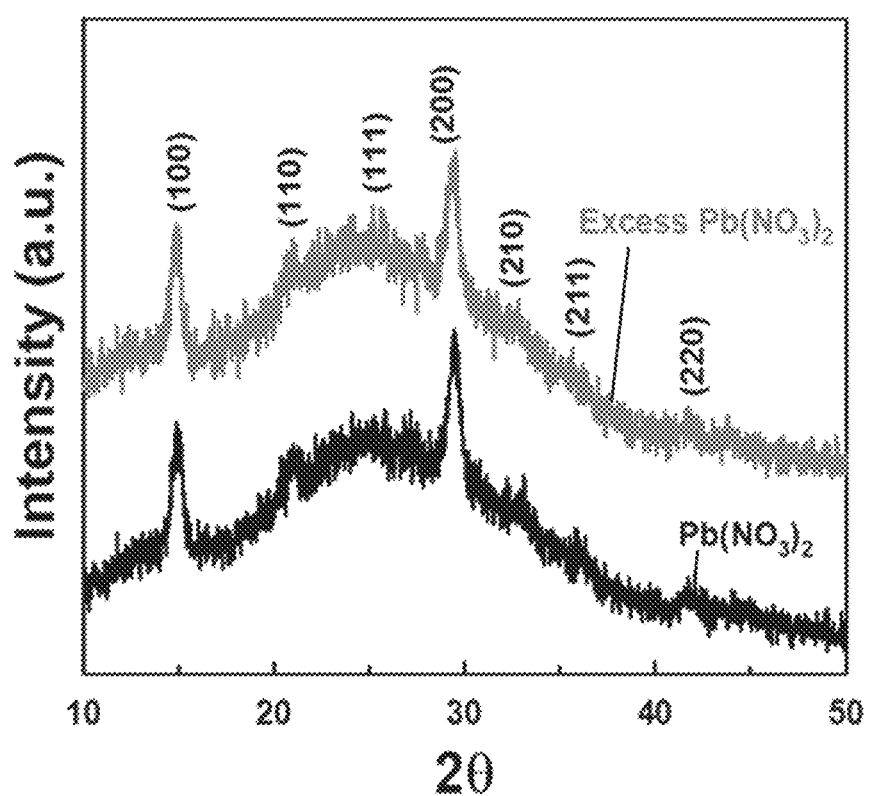
FIG. 3B is a diagram showing the results of X-ray diffraction of $CsPbI_3$-PQD films treated with Pb$(NO_3)_2$ and excess Pb$(NO_3)_2$
Figure 3C:
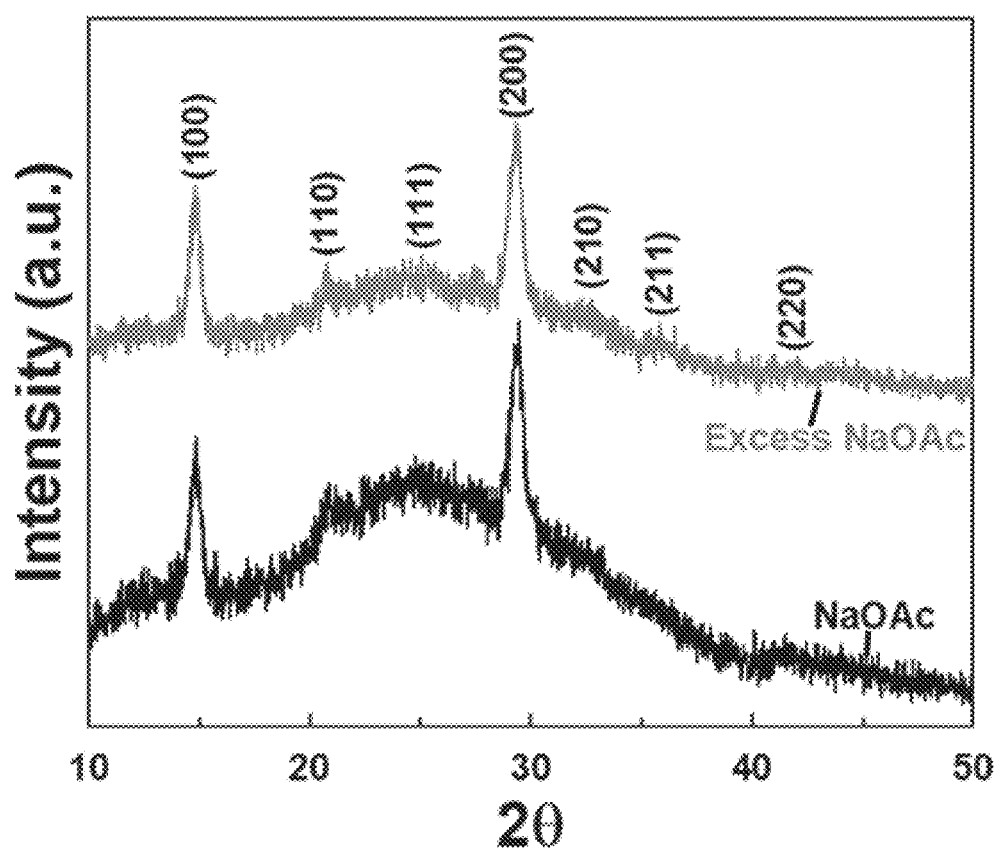
FIG. 3C is a diagram showing the results of X-ray diffraction of $CsPbI_3$-PQD films treated with NaOAc and excess NaOAc.

When the CsPbI$_3$-PQD solid was treated with excess Pb(OAc)$_2$, the diffraction peaks corresponding to (100) and (200) were increased approximately twice than those of Comparative Example 1.3 (FIG. 3A). However, treatment with excess Pb(NO$_3$)$_2$ or NaOAc did not affect the growth of CsPbI$_3$-PQD crystals during ligand exchange (FIGS. 3B and 3C). From the results above, it was confirmed that NaOAc could be used as the OAc$^-$-based ionic salt capable of directly generating OAc ions during ligand exchange of CsPbI$_3$-PQDs.

1.3. X-Ray Photoelectron Spectroscopy

Figure 4A:
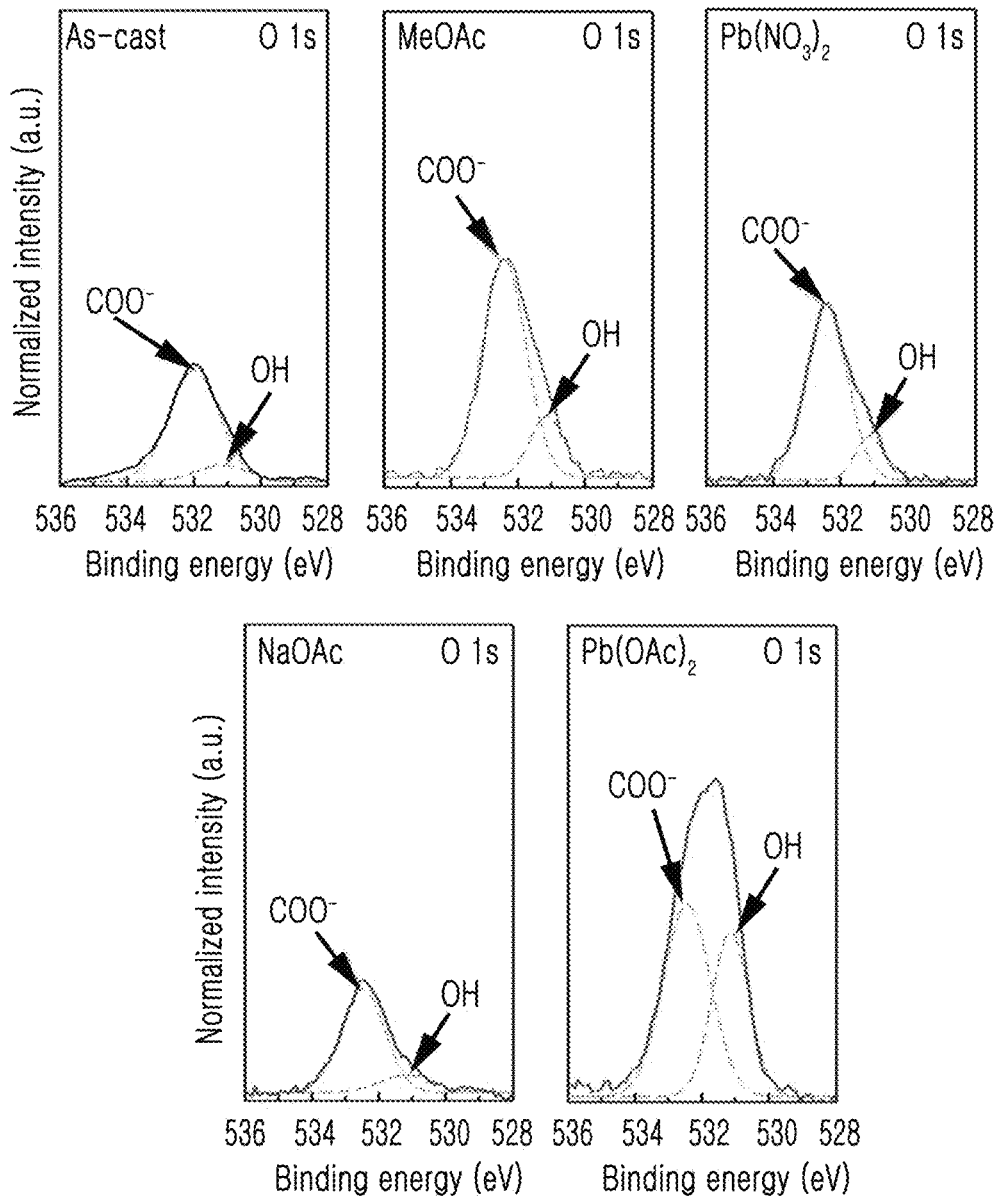
FIG. 4A is a diagram showing the results of X-ray photoelectron analysis of $CsPbI_3$-PQDs treated with neat MeOAc, Pb$(NO_3)_2$, NaOAc, Pb$(OAc)_2$.
Figure 4B:
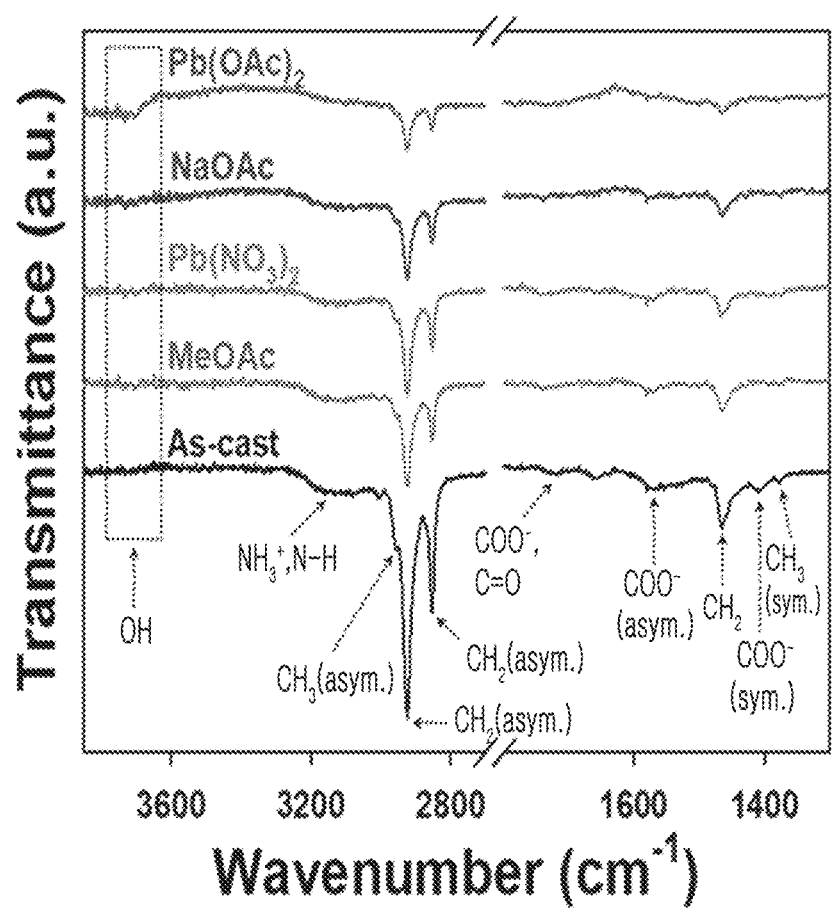
FIG. 4B is a diagram showing the FT-IR spectrum of $CsPbI_3$-PQDs treated with neat MeOAc, Pb$(NO_3)_2$, NaOAc, Pb$(OAc)_2$.

X-ray Photoelectron spectroscopy (XPS) Was conducted to confirm the chemical composition and electron state before and after ligand exchange in the films of Example 1 and Comparative Examples 1.1 to 1.3. The results are shown in FIG. 4A and Table 1. Binding energy was corrected using C is peak at 284.5 eV. The element composition and peak intensity were standardized using the measured values of Pb element and the maximum intensity of Pb 3d$_{5/2}$ peak, respectively.

The non-ligand exchanged CsPbI$_3$-POD thin film showed slightly higher Cs/Pb and I/Pb ratios than 1 and 3, respectively. This is because a significant portion of the CsPbI$_3$ perovskite is cube-shaped nanocrystals, about 10 nm in size, whose surface ends with Cs— or I—. Ligand exchange of long hydrocarbon chains of oleate ligands of the CsPbI$_3$-PQD with short chains of OAc ions led to a significant reduction of the C/Pb ratio. The I/Pb ratio of the film of Comparative Example 1.3 was less than 3 and the C/Pb ratio thereof was the smallest. Through this, it was confirmed that the I-deficient surface due to the growth of CsPbI$_3$ perovskite crystals and the reaction of excess I with Pb(OAc)$_2$ remained on the CsPbI$_3$-PQD surface. The I/Pb ratio of the films of Example 1, Comparative Example 1.1 and Comparative Example 1.2 was 3 or more, indicating that the CsPbI$_3$-PQD size was maintained. Among the films of Example 1, Comparative Example 1.1 and Comparative Example 1.2 in which the nanocrystal size of CsPbI$_3$-PQD was maintained, the C/Pb ratio of the film of Example 1 was the smallest. Thereof, it was confirmed that NaOAc treatment was very effective in removing the long chains of oleate ligands connected to the surface of CsPbI$_3$-PQDs.

TABLE 1

|  | As-cast | Comparative Example 1.1 | Comparative Example 1.2 | Comparative Example 1.3 | Example 1 |
|---|---|---|---|---|---|
| Cs 3d$_{5/2}$ | 1.04 | 1.14 | 1.13 | 1.09 | 1.14 |
| Pb 4f$_{7/2}$ | 1.00 | 1.00 | 1.00 | 1.00 | 1.00 |
| I 3d$_{5/2}$ | 3.20 | 3.21 | 3.15 | 2.91 | 3.25 |
| C 1s | 8.08 | 4.48 | 4.27 | 3.48 | 3.93 |
| O 1s | 0.49 | 0.93 | 0.65 | 1.08 | 0.48 |

To investigate the oxygen signal origin in detail, O 1s spectra were deconvolutiond into two peaks corresponding to different chemical species. The results are shown in FIG. 4A. The O 1s peak at 532.5 eV was originated from the carboxylate group (COO$^-$) derived from the oleate and OAc ions bound to the surface of CsPbI$_3$-PODs. and the peak at 531.2 eV was originated from the metal hydroxide (ie Pb—OH) derived from the methanol produced by hydrolysis of MeOAc.

The film of Example 1 showed the lowest contribution at 531.2 eV, indicating that Pb—OH was formed in the smallest amount after ligand exchange. The Pb—OH formation led to sub-bandgap trap states in PbS CQDs and low charge transport of lead halide perovskite, resulting in poor photovoltaic cell performance. In addition, polar solvents, such as alcohols, induced lattice distortion of the cube-shaped $CsPbI_3$ nanocube, leading to a phase change into the orthorhombic structure. The O/Pb ratio and $COO^-/OH$ ratio of the thin film of Example 1 were almost the same as those of the as-cast $CsPbI_3$-PQD thin film stabilized by oleate and oleylammonium ligands in which the ligand exchange reaction did not undergo. This showed low surface trap states and high photoluminescence quantum yields (PLQYs).

These results indicate that NaOAc treatment can maintain the surface trap state unique to the $CsPbI_3$-PQDs thin film without cubic phase instabilization andhydrolysis of MeOAc, which can be negatively affected by oxygen species. The highest O 1s peak of the film of Comparative Example 1.3 was shifted to a low binding energy (531.5 eV) and the Pb—OH signal was significantly increased, indicating that the surface Pb—OH bond was more dominant than $COO^-$.

1.4. FT-IR Spectrum Analysis

FT-IR spectrum of the $CsPbI_3$-PQDs before and after ligand exchange was analyzed. The results are shown in FIG. 4R.

The $CsPbI_3$-PQD thin film without ligand exchange showed IR signals of aliphatic hydrocarbon chains (1380, 1470, 2850, 2920, 2960 $cm^{-1}$), $COO^-$ (1410, 1560, 1710 $cm^{-1}$) and ammonium (3000-3200 $cm^{-1}$) originated from oleic acid and oleylammonium ligands. The thin films of Example 1 and Comparative Examples 1.1 to 1.3 showed reduced aliphatic IR signals. In particular, the thin film of Comparative Example 1.3 showed an additional IR signal at 3650 $cm^{-1}$, which corresponds to the O—H stretching peak and Pb—OH bending peak of the metal hydroxide formed during the growth of $CsPbI_3$ perovskite crystals. The thin film of Example 1 exhibited lower IR signals of aliphatic hydrocarbon chains than the thin film of Comparative Example 1.2. This showed that NaOAc removed long chains of oleate more effectively.

1.5. Photoluminescence Spectrum Analysis

Figure 4C:
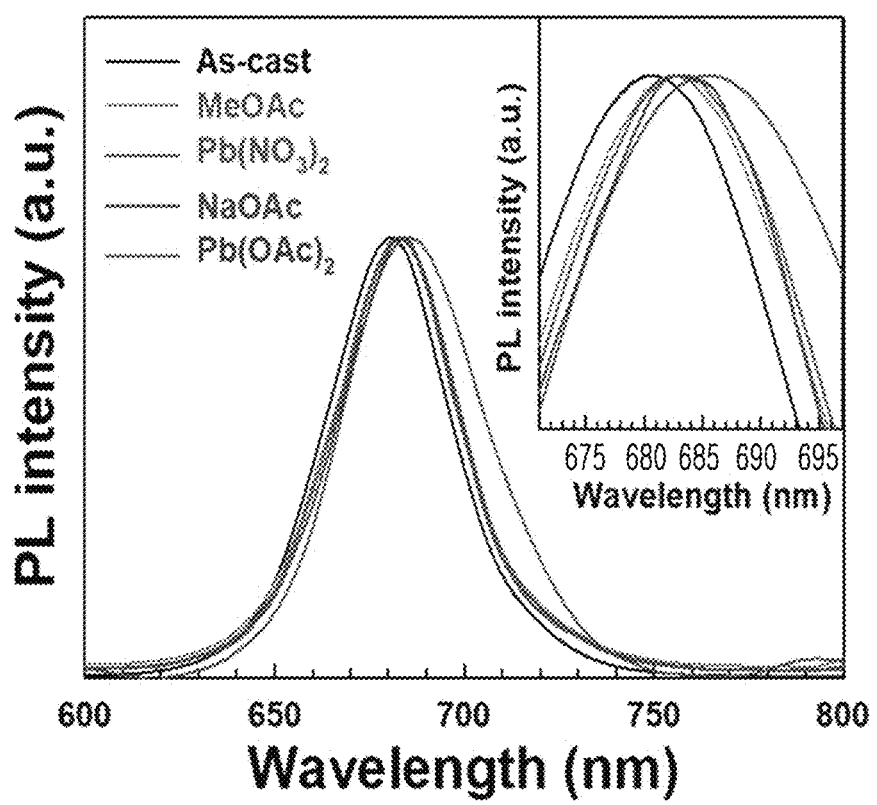
FIG. 4C is a diagram showing the PL spectrum of $CsPbI_3$-PQDs treated with neat MeOAc, Pb$(NO_3)_2$, NaOAc, Pb$(OAc)_2$.

Photoluminescence (PL) spectrum of the $CsPbI_3$-PQDs before and after ligand exchange was analyzed. The results are shown in FIG. 4C and table 2.

The Pt spectrum of the $CsPbI_3$-PQD was red-shifted from 680 nm to 683 nm as the distance between nanocrystals was decreased due to the removal of oleic acid ligands by treatment of the ligand exchange solution. In addition, the thin film of Example 1 exhibited the narrowest full-width at half-maximum (FWHM) of 36.9 nm, indicating that the $CsPbI_3$-PQDs were more effectively maintained in low aggregation and surface trap states during ligand exchange. The PL spectrum of the thin film of Comparative Example 1.3 showed a wider FWHM (41.4 nm) and red-shift to 685 nm, indicating that it was much more fused than other $CsPbI_3$-PQDs and remained in the surface trap state.

TABLE 2

| | As-cast | Comparative Example 1.1 | Comparative Example 1.2 | Comparative Example 1.3 | Example 1 |
|---|---|---|---|---|---|
| PL peak (nm) | 680 | 683 | 683 | 685 | 683 |
| FWHM (nm) | 37.5 | 38.8 | 38.6 | 41.4 | 36.9 |

1.6. Ultraviolet Photoelectron Spectroscopy

Figure 5A:
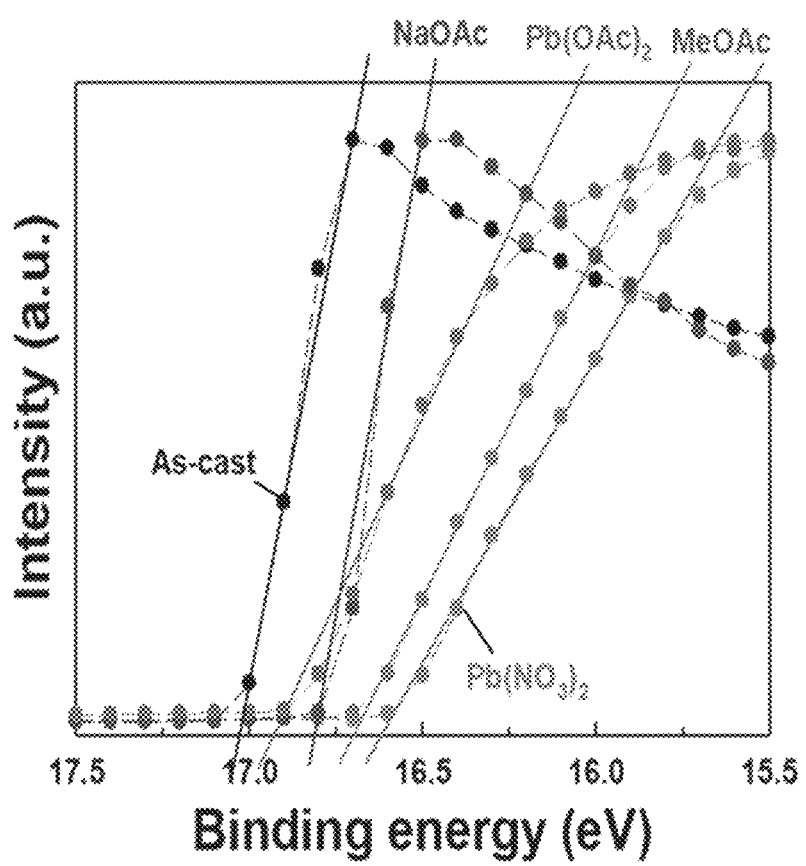
FIG. 5A and FIG. 5B are diagrams showing the results of ultraviolet photoelectron spectroscopy of $CsPbI_3$-PODs treated with neat MeOAc, Pb$(NO_3)_2$, NaOAc, Pb$(OAc)_2$.
Figure 5B:
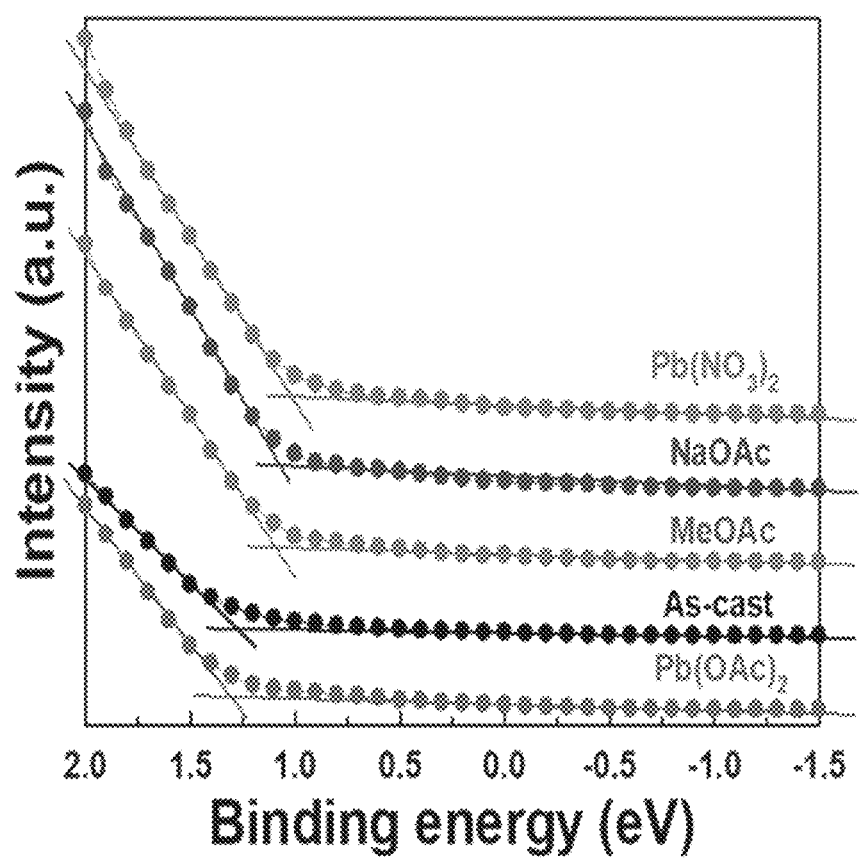
Figure 5C:
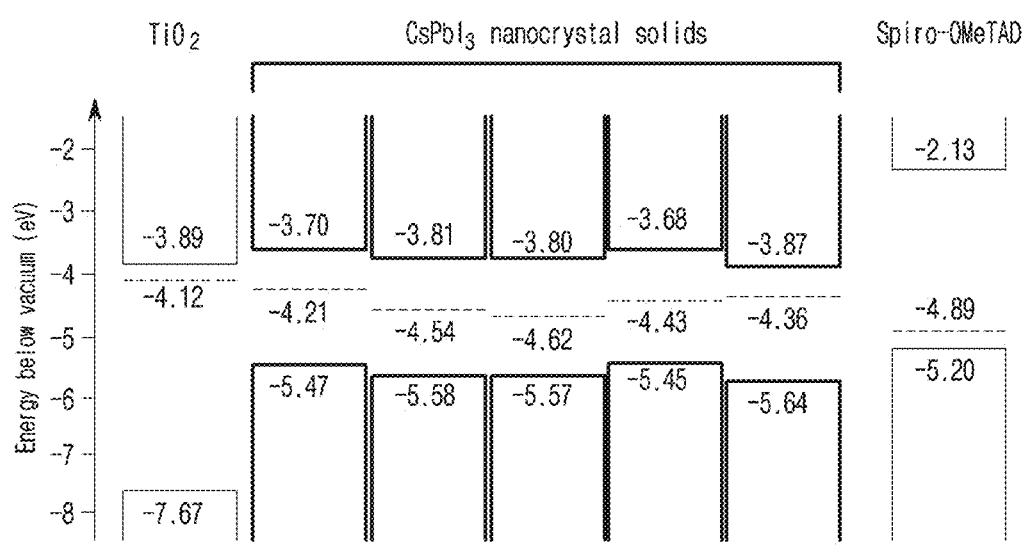
FIG. 5C is a diagram showing the energy band diagram of $CsPbI_3$-PQDs treated with neat MeOAc, Pb$(NO_3)_2$; NaOAc, Pb$(OAc)_2$, compact $TiO_2$ and Spiro-MeOTAD.

Ultraviolet photoelectron spectroscopy (UPS) was conducted to confirm the energy levels of the $CsPbI_3$-PQDs affecting photovoltaic cell action before and after ligand exchange. The results are shown in FIG. 5A to 5C.

The Fermi energy ($E_F$) and valence band energy ($E_V$) levels were determined by cutoff energy ($E_{cutoff}$) in the high binding energy region and linear extrapolation fa the low binding energy region, respectively. An energy level diagram of the $CsPbI_3$-PQD solar cell is shown in FIG. 5C. Compared with the energy levels of c-$TiO_2$ and Spiro-MeOTAD, the thin film of Example 1 showed an upward shift at the conduction band minimum (CBM) and valence band maximum (VBM) levels. This indicates that the charge extraction, such as electrons and holes, is more energetic in the thin film of Example 1 than the thin films of Comparative Examples 1.2 and 1.3.

Experimental Example 2

Analysis of Solar Cell Solar Performance

To confirm the performance of a solar cell comprising the $CsPbI_3$-PQD thin film using sodium acetate (NaOAc) according to the present invention, the power conversion efficiency of the solar cells prepared in Example 2 and Comparative Example 2 was analyzed.

2.1. Scanning Electron Microscopy

Figure 6A:
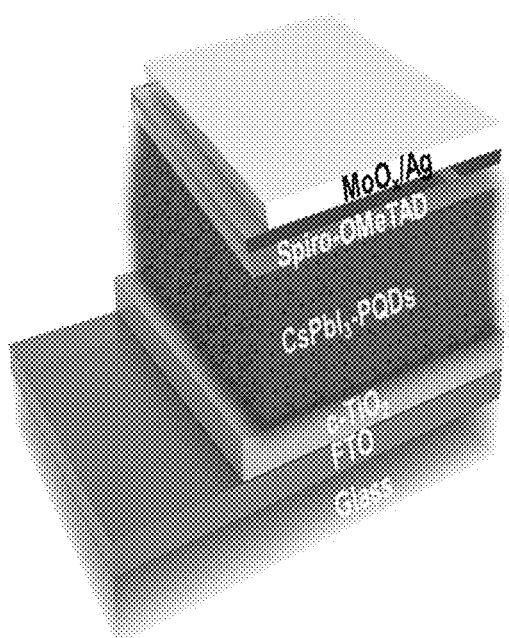
FIG. 6A is a diagram showing the scanning electron microscope image of $CsPbI_3$-PQD solar cell.
Figure 6A:
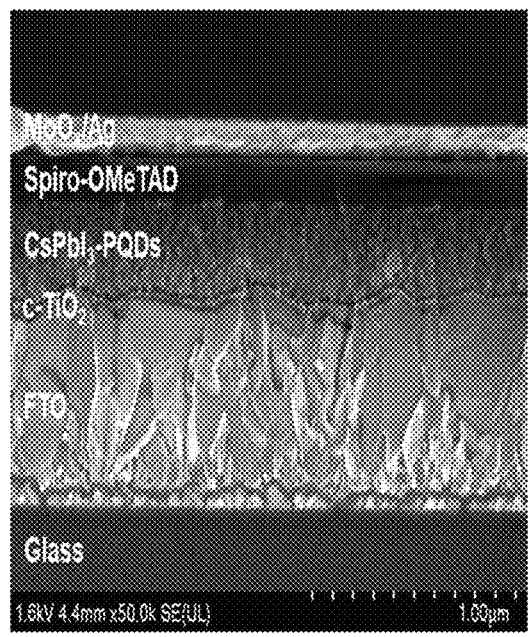

Scanning electron microscopy (SEM) images of the solar cells prepared Example 2 and Comparative Examples 2.1 and 2.2 were analyzed. The results are shown in FIG. 6A.

$CsPbI_3$-PQDs were prepared on the c-$TiO_2$ layer as an electron transfer layer (ETL). Then, Spiro-OMeTAD was used as a hole transfer layer (HTL), and $MoO_x/Ag$ was prepared as an upper electrode.

2.2. Analysis of J-V Curves and External Quantum Efficiency

Figure 6B:
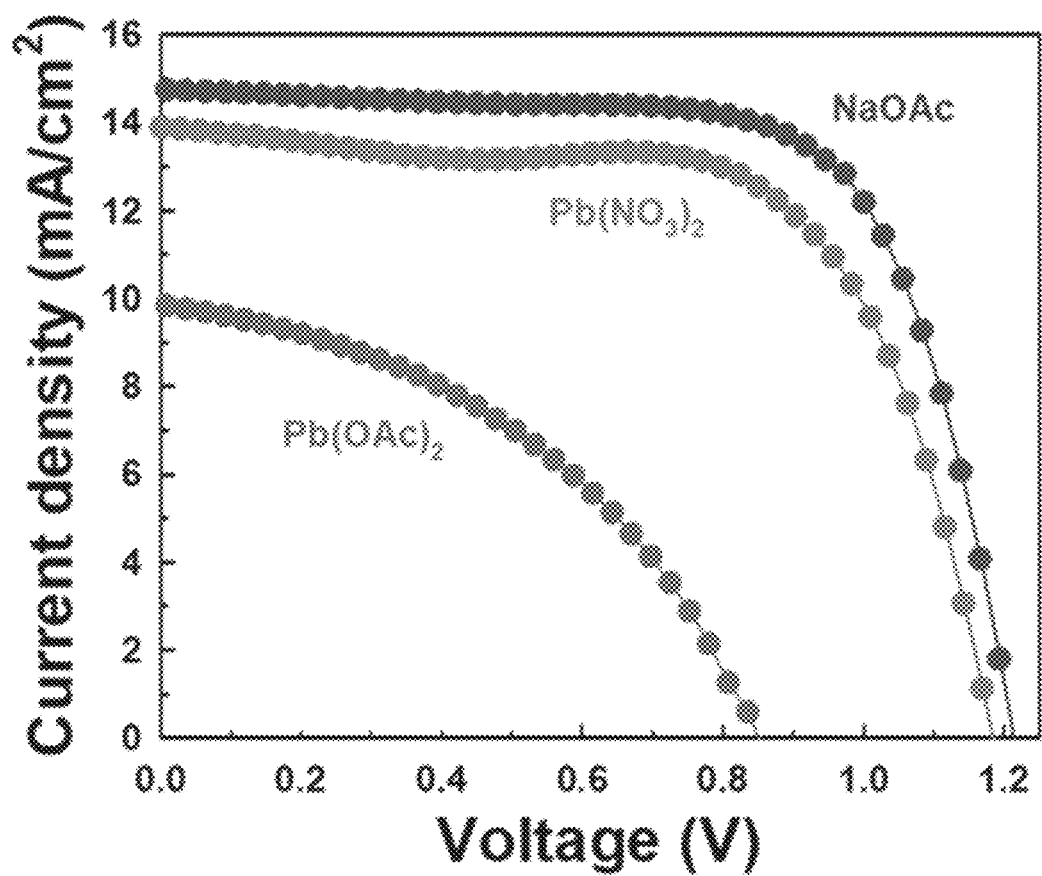
FIG. 6B is a diagram showing the J-V curve of $CsPbI_3$-PQD solar cell.
Figure 6C:
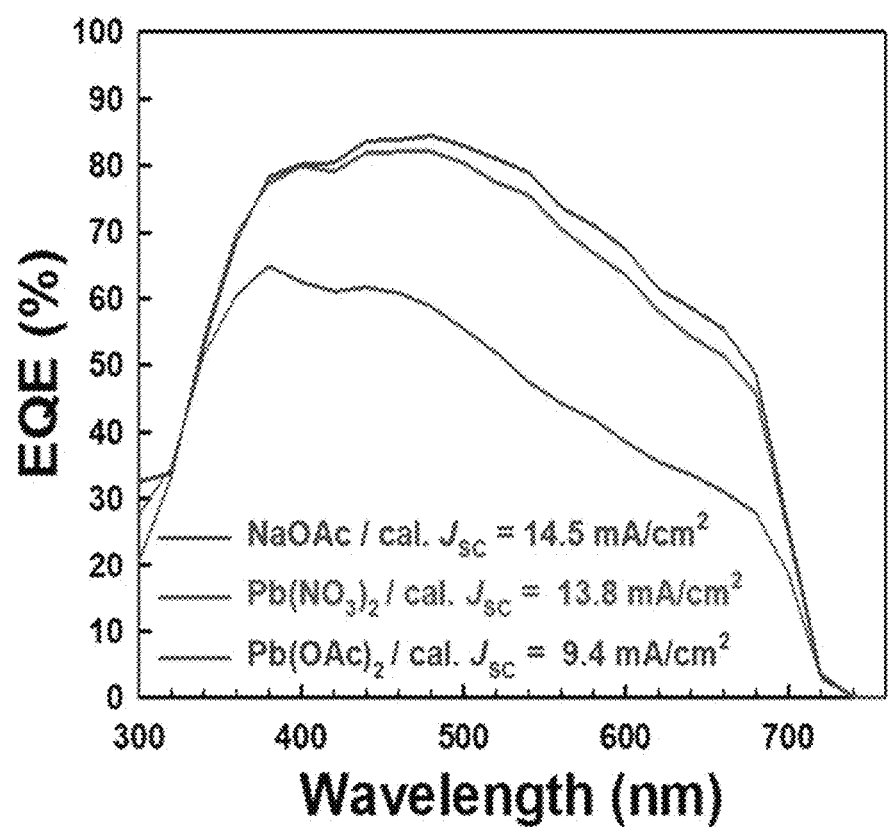
FIG. 6C is a diagram showing the external quantum efficiency spectrum of $CsPbI_3$-POD solar cell.
Figure 7:
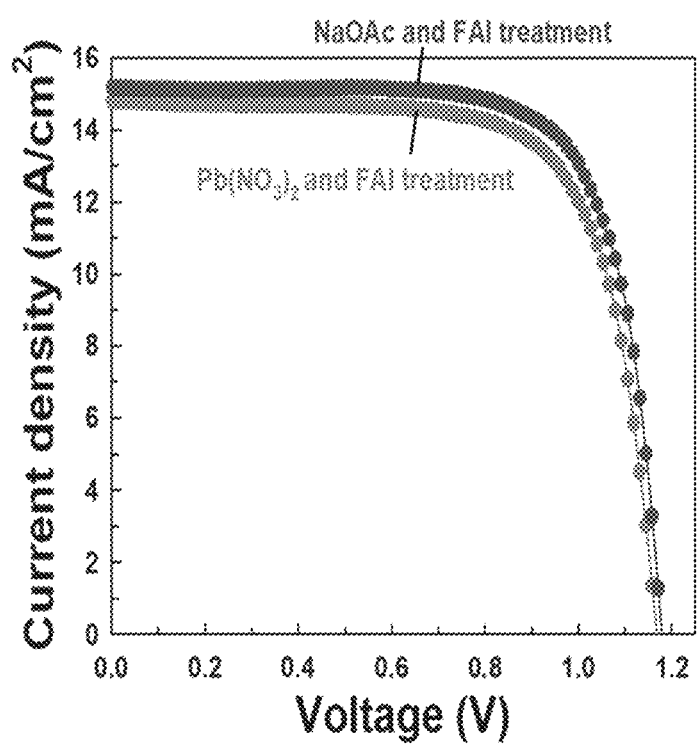
FIG. 7 is a diagram showing the J-V curve and the parameters of the $CsPbI_3$-POD solar cells of Example 2 and Comparative Example 2.1 post-treated with FAI, respectively.

Current density-voltage (J-V) curves, detailed device parameters and external quantum efficiency (EQE) spectra of the solar cells of Example 2, Comparative Example 2.1 and Comparative Example 2.2 were analyzed. The results are shown in FIGS. 6B and 6C and table 3.

The solar cell of Comparative Example 2.1 showed 10.7% of PCE, and the solar cell of Example 2 showed the highest POE of 12.4%. This is due to the ligand exchange process that generated OAc ions directly from NaOAc salts to replace the long chain of oleic acid ligand with the short chain of OAc ions. In particular, the improvement of $J_{sc}$ and FF of the solar cell of Example 2 was strongly related to the enhanced charge transport capability of $CsPbI_3$-PODs as well as the favorable band alignment of the solar cell device. However, the solar cell of Comparative Example 2.2 showed low efficiency due to poor fusion of $CsPbI_3$-PQDs and surface morphology. Specifically, the power conversion efficiency of the solar cell of Example 2 was about 16% higher than that of the solar cell of n Comparative Example 2.2, the open voltage of the solar cell of Example 2 was about 42% higher than that of the solar cell of Comparative Example 2.1, and the power conversion efficiency of the solar cell of Example 2 was also about 249% higher than that of the solar cell of Comparative Example 2.1.

Therefore, it was confirmed that the efficiency of the solar cell using the $CsPbI_3$-PQD thin film ligand-exchanged with a ligand solution containing NaOAc ion salts as an photovoltaic absorber layer was excellent.

TABLE 3

|  | $V_{OC}$ (V) | $J_{SC}$ (mA/cm$^2$) | FF (%) | PCE (%) |
|---|---|---|---|---|
| Example 2 | 1.21 | 14.7 | 69.6 | 12.4 |
| Comparative Example 2.1 | 1.19 | 13.9 | 65.3 | 10.7 |
| Comparative Example 2.2 | 0.85 | 9.83 | 42.5 | 3.55 |

2.3. Analysis of Power Conversion Efficiency

Additional FAI post-treatment was performed on the thin films of Example 1 and Comparative Example 1.3 to replace the oleylammonium ligands with the short chains of FA cations. The power conversion efficiency at this time was investigated. The results are shown in FIG. When Post-treatment was performed on the thin film of Example 1, PCE was 13.3% without the aid of MgF$_2$ antireflective coating, and when FAI post-treatment was performed on the thin film of Comparative Example 1.3, PCE was 12.4%.

From the above results, it was confirmed that NaOAc removed the oleate ligands very efficiently, and enhanced the electronic coupling of CsPbI$_3$-PQDs.

Figure 8:
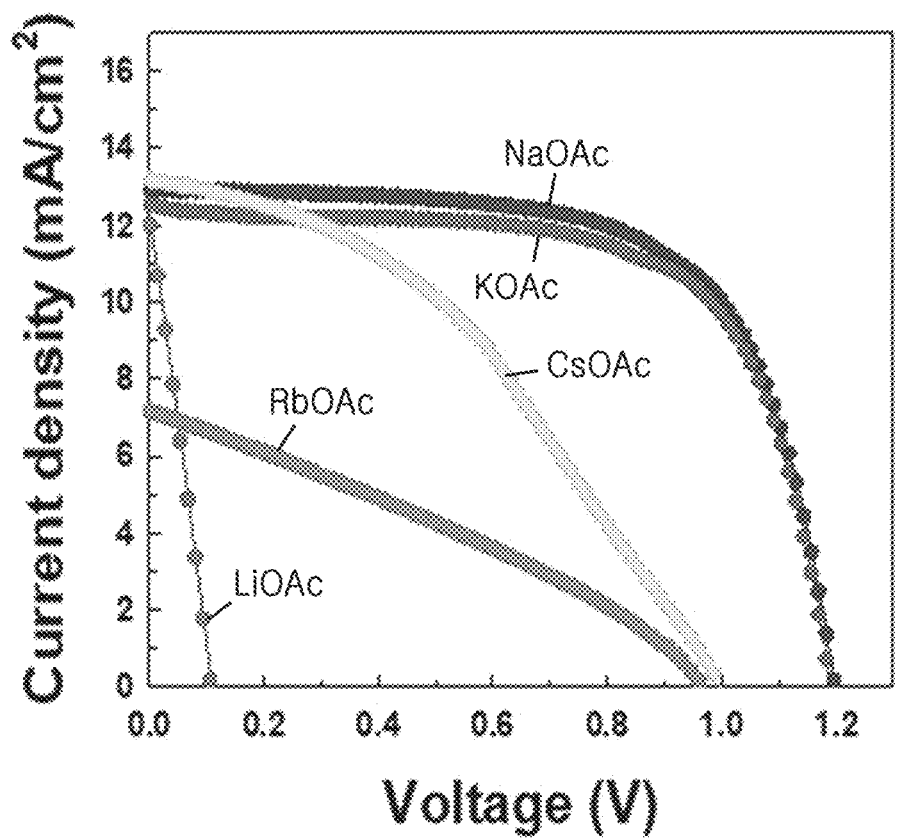
FIG. 8 is a graph showing the of the J-V curve $CsPbI_3$-PQD solar cells of Example 2 and Comparative Examples 2.3 to 2.6.

To evaluate the power conversion efficiency of the solar cells using acetate salts containing various alkali metal cations, the power conversion efficiency of the solar cells of Example 2 and Comparative Examples 2.3 to 2.6 was investigated. The results are shown in FIG. 8 and table 4.

TABLE 4

|  | $V_{OC}$ (V) | $J_{SC}$ (mA/cm$^2$) | FF (%) | PCE (%) |
|---|---|---|---|---|
| Example 2 | 1.20 | 12.9 | 66.2 | 10.2 |
| Comparative Example 2.3 | 0.19 | 12.2 | 28.8 | 0.67 |
| Comparative Example 2.4 | 1.19 | 12.5 | 67.0 | 9.94 |
| Comparative Example 2.5 | 0.96 | 7.14 | 31.4 | 2.16 |
| Comparative Example 2.6 | 0.99 | 13.1 | 39.9 | 5.20 |

The power conversion efficiency of the solar cell of Example 2 using Na cations was the highest, which was 10.2%, and the power conversion efficiency of the solar cell of Comparative Example 2.4 using K cations was also high as 9.94%. On the other hand, the solar cells of Comparative Examples 2.3, 2.5 and 2.6 using Li cations, Rb cations and Cs cations showed low power conversion efficiency of 0.67%, 2.16% and 5.20%, respectively. Therefore, it was confirmed that the efficiency of the CsPbI$_3$-PQD solar cell comprising acetate containing Na cations was the best.

As mentioned above, the present invention has been described in detail through the preferred preparative examples, examples and experimental examples, but the scope of the present invention is not limited to the specific examples, and should be interpreted by the appended claims. In addition, those of ordinary skill in the art should understand that many modifications and variations are possible without departing from the scope of the present invention.

What is claimed is:

1. A preparation method of an inorganic perovskite quantum dot thin film comprising the following steps:
    forming an inorganic perovskite quantum dot layer; and
    treating the surface of the quantum dot layer with a ligand exchange solution containing an ionic salt represented by formula 1, and replacing a surface ligand with ions represented by formula 2 generated by dissociation of the ionic salt of formula 1:

$R^1COO^-A^+$     [Formula 1]

(In formula 1,
    $R^1$ is C$_{1-5}$ straight or branched alkyl; and
    $A^+$ is Na$^+$ or K$^+$)

$R^2COO^-$     [Formula 2]

(In formula 2,
    $R^2$ is C$_{1-5}$ straight or branched alkyl).

2. The preparation method of an inorganic perovskite quantum dot thin film according to claim 1, wherein the step of replacing the surface ligand with the ions represented by formula 2 is performed by solid-state ligand exchange (SLE) reaction.

3. The preparation method of an inorganic perovskite quantum dot thin film according to claim 1, wherein the step of forming the inorganic perovskite quantum dot layer is performed by using a perovskite quantum dot solution.

4. The preparation method of an inorganic perovskite quantum dot thin film according to claim 1, wherein the steps are repeatedly performed two to eight times.

5. The preparation method of an inorganic perovskite quantum dot thin film according to claim 2, wherein the ionic salt represented by formula 1 is CH$_3$COO—Na$^+$ (sodium acetate).

* * * * *